(12) United States Patent
Sham et al.

(10) Patent No.: US 8,671,323 B2
(45) Date of Patent: Mar. 11, 2014

(54) HIGH THROUGHPUT DECODER ARCHITECTURE FOR LOW-DENSITY PARITY-CHECK CONVOLUTIONAL CODES

(75) Inventors: Chiu Wing Sham, Hong Kong (HK); Xu Chen, Hong Kong (HK); Chung Ming Lau, Hong Kong (HK); Yue Zhao, Hong Kong (HK); Wal Man Tam, Hong Kong (HK)

(73) Assignee: The Hong Kong Polytechnic University, Hong Kong (HK)

( * ) Notice: Subject to any disclaimer, the term of this patent is extended or adjusted under 35 U.S.C. 154(b) by 197 days.

(21) Appl. No.: 13/371,067

(22) Filed: Feb. 10, 2012

(65) Prior Publication Data

US 2013/0212450 A1  Aug. 15, 2013

(51) Int. Cl.
*H03M 13/00* (2006.01)
(52) U.S. Cl.
USPC ............................ 714/755; 714/786; 714/773
(58) Field of Classification Search
USPC .......................................... 714/755, 786, 773
See application file for complete search history.

(56) References Cited

U.S. PATENT DOCUMENTS

2006/0047857 A1*  3/2006  Dabiri et al. .................. 709/250
2010/0199153 A1*  8/2010  Okamura et al. ............. 714/781

OTHER PUBLICATIONS

Z. Chen, T. Brandon, D. Elliott, S. Bates, W. Krzymien, and B. Cockburn, "Jointly designed architecture-aware LDPC convolutional codes and high-throughput parallel encoders/decoders," *Circuits and Systems I: Regular Papers, IEEE Transactions on*, vol. 57, No. 4, pp. 836-849, Apr. 2010.

R. Swamy, S. Bates, T. Branson, B. Cockburn, D. Elliott, J. Koob, and Z. Chen, "Design and test of a 175-mb/s, rate-1/2 (128,3,6) low-density parity-check convolutional code encoder and decoder," *Solid-State Circuits, IEEE Journal of*, vol. 42, No. 10, pp. 2245-2256, Oct. 2007.
M. Tavares, E. Matus, S. Kunze, and G. Fettweis, "A dual-core programmable decoder for LDPC convolutional codes," in *Circuits and Systems, 2008. ISCAS 2008. IEEE International Symposium on*, May 2008, pp. 532-535.
T. Brandon, J. Koob, L. van den Berg, Z. Chen, A. Alimohammad, R. Swamy, J. Klaus, S. Bates, V. Gaudet, B. Cockburn, and D. Elliott, "A compact 1.1-gb/s encoder and a memory-based 600-mb/s decoder for LDPC convolutional codes," *Circuits and Systems I: Regular Papers, IEEE Transactions on*, vol. 56, No. 5, pp. 1017-1029, May 2009.

(Continued)

*Primary Examiner* — Guy Lamarre
(74) *Attorney, Agent, or Firm* — Muncy, Geissler, Olds & Lowe, P.C.

(57) ABSTRACT

A Low-Density Parity-Check Convolutional Code (LPDCCC) decoder (10) for partial parallel decoding of low-density parity-check convolutional codes, the decoder having: a plurality of pipeline processors (11) to receive channel messages and edge-messages; each processor (11) having: a plurality of block processing units (BPUs) (13), each BPU (13) having a plurality of check node processors (CNPs) (14) to process check nodes that enter into the processor (11) and a plurality of variable node processors (VNPs) (15) to process variable nodes that are about to leave the processor (11); and a plurality of Random Access Memory (RAM) blocks (30) for dynamic message storage of the channel messages and the edge-messages; wherein in each processor (11), the VNPs (15) are directly connected to corresponding RAM blocks (30), and the CNPs (14) are directly connected to corresponding RAM blocks (30) such that the connections from the VNPs (15) and CNPs (14) to the corresponding RAM blocks (30) are pre-defined and fixed according to a parity-check matrix of an unterminated time-varying periodic LDPCCC.

18 Claims, 15 Drawing Sheets

(56) References Cited

OTHER PUBLICATIONS

S. Bates, Z. Chen, L. Gunthorpe, A. Pusane, K. Zigangirov, and D. Costello, "A low-cost serial decoder architecture for low-density parity-check convolutional codes," *Circuits and Systems I: Regular Papers, IEEE Transactions on*, vol. 55, No. 7, pp. 1967-1976, Aug. 2008.

Z. Chen, S. Bates, and W. Krzymien, "High throughput parallel decoder design for LDPC convolutional codes," in *Circuits and Systems for Communications, 2008. ICCSC 2008. 4th IEEE International Conference on*, May 2008, pp. 35-39.

E. Matus, M. Tavares, M. Bimberg, and G. Fettweis, "Towards a gbit/s programmable decoder for LDPC convolutional codes," in *Circuits and Systems, 2007. ISCAS 2007. IEEE International Symposium on*, May 2007, pp. 1657-1660.

S. B. D. J. Costello Jr., A. E. Pusane and K. S. Zigangirov, "A comparison between LDPC block and convolutional codes," in *Proc. Workshop Information Theory Its Applications*, 2006.

S. Bates and G. Block, "A memory-based architecture for fpga implementations of low-density parity-check convolutional decoders," in *Circuits and Systems, 2005. ISCAS 2005. IEEE International Symposium on*, May 2005, pp. 336-339 vol. 1.

A. Pusane, A. Feltstrom, A. Sridharan, M. Lentmaier, K. Zigangirov, and D. Costello, "Implementation aspects of LDPC convolutional codes," *Communications, IEEE Transactions on*, vol. 56, No. 7, pp. 1060-1069, Jul. 2008.

\* cited by examiner

Figure 2

$$H^b = \begin{bmatrix} H^b_{1,1} & H^b_{1,2} & & & & H^b_{1,M} \\ H^b_{2,1} & H^b_{2,2} & H^b_{2,3} & & & H^b_{2,M} \\ & & H^b_l & & H^b_u & \vdots \\ & & & & & H^b_{M-1,M} \\ H^b_{M,1} & H^b_{M-1,1} & & & H^b_{M,M-1} & H^b_{M,M} \end{bmatrix}$$

$$\downarrow$$

$$H^{cc}_{[0,\infty]} = \begin{bmatrix} H^b_l & H^b_u & & & \\ & H^b_l & H^b_u & & \\ & & H^b_l & H^b_u & \\ & & & \ddots & \ddots \end{bmatrix}$$

Bi: processing of block i
S-W: Shift messages and write messages to the next processor
R: Input messages to the block processing unit
CNP: check node processing
VNP: variable node processing Bi: processing of block i
S-W: Shift messages and write messages to the next processor
R: Input messages to the block processing unit
CNP: check node processing
VNP: variable node processing

Figure 7A

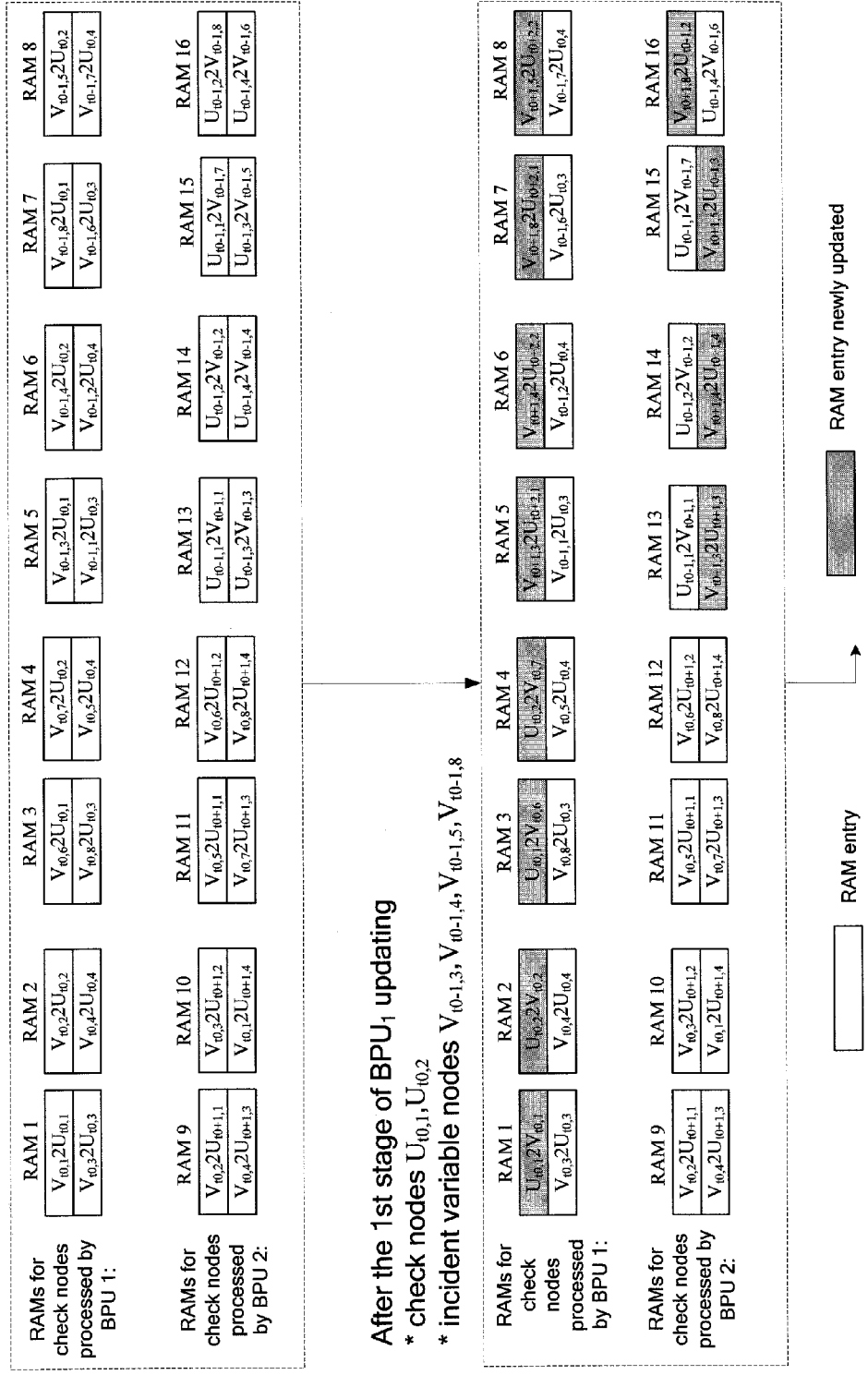

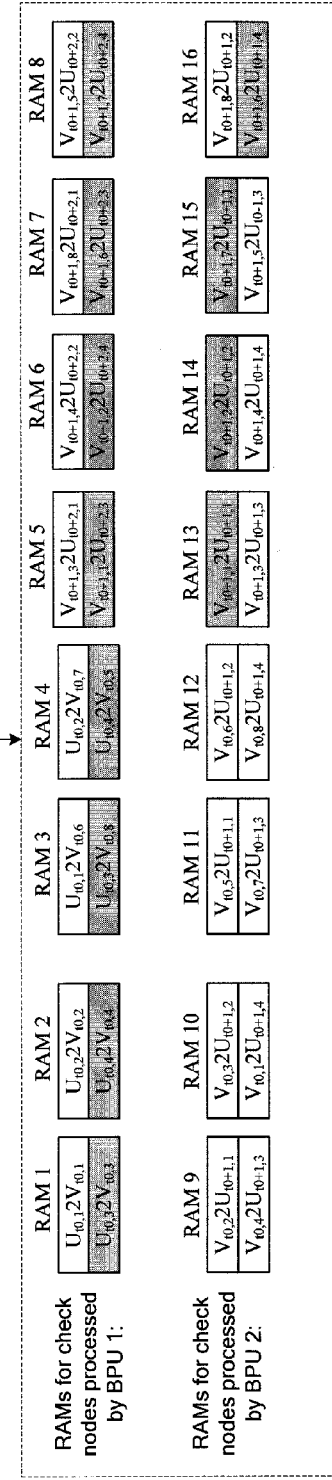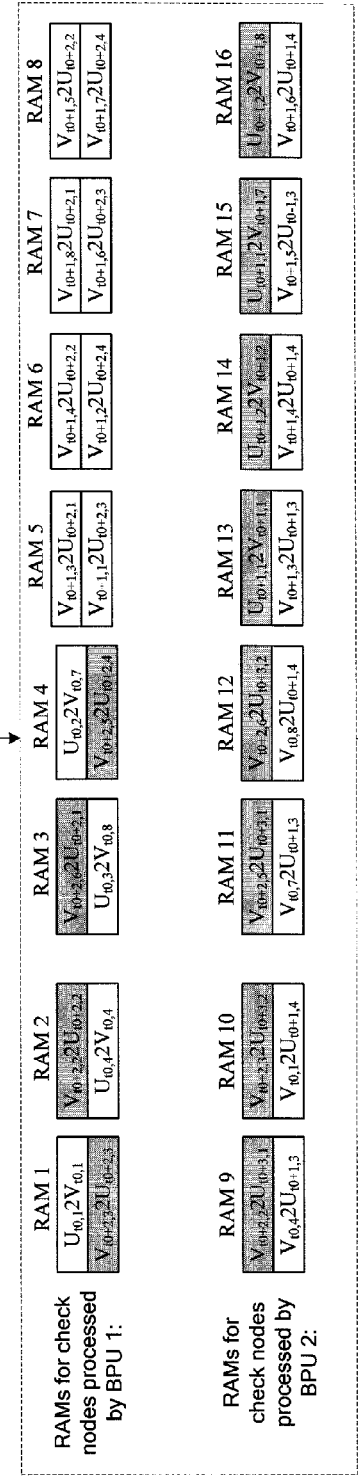
Figure 7C

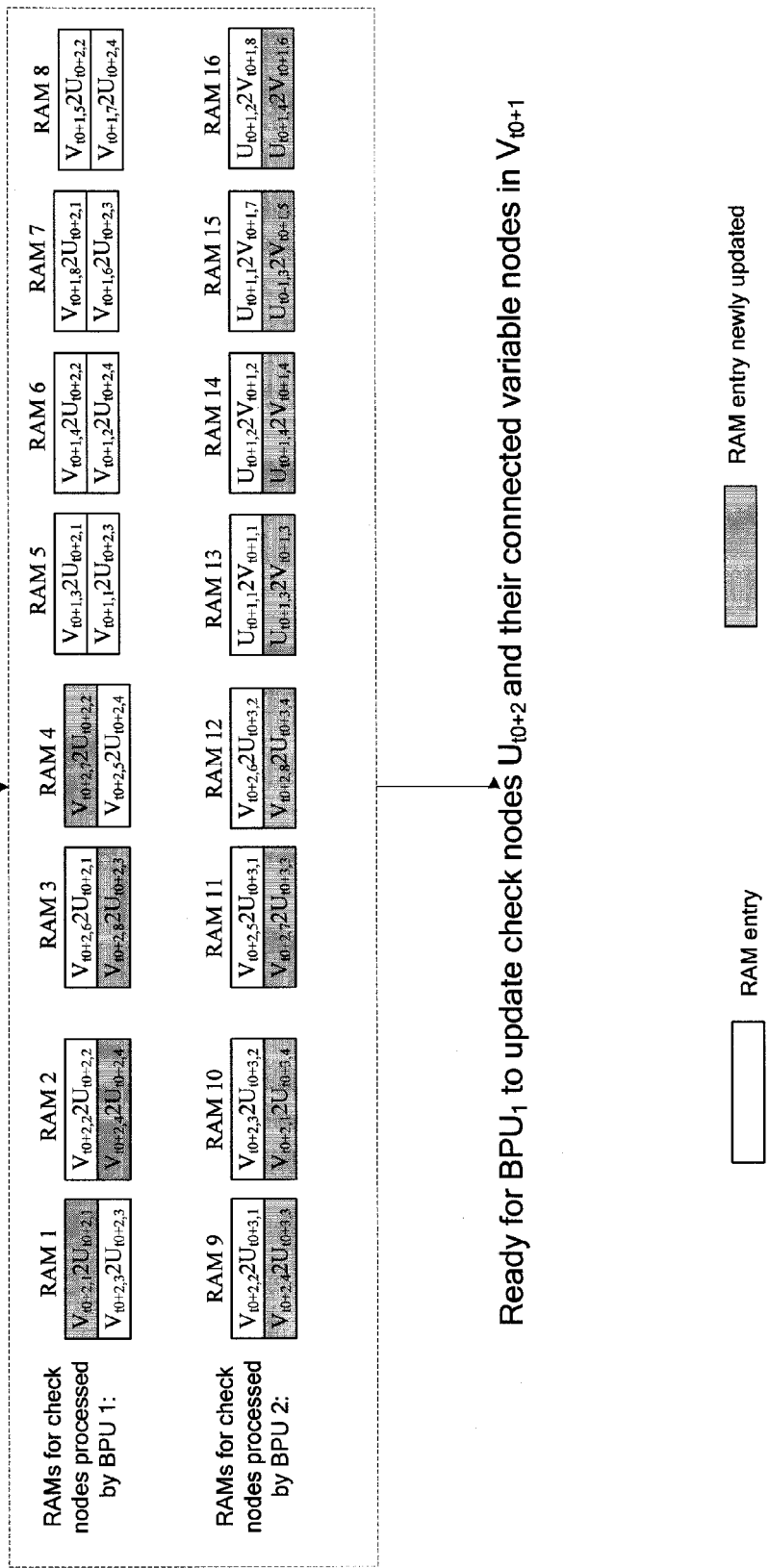

HIGH THROUGHPUT DECODER ARCHITECTURE FOR LOW-DENSITY PARITY-CHECK CONVOLUTIONAL CODES

TECHNICAL FIELD

The invention concerns a high throughput decoder architecture for low-density parity-check convolutional codes.

BACKGROUND OF THE INVENTION

Low-density parity-check convolutional codes (LDPC-CCs) achieve a better error performance than the LDPC block-code counterparts of similar decoding complexity. LDPCCCs have inherited the basic structure of convolutional codes therefore allowing continuous encoding and decoding of codes with variable length. This property has made LDPC-CCs a promising technique in many applications.

Several parallelization concepts for the decoding process that lead to a high-throughput decoder architecture can achieve an information throughput of over 1 Gb/s with a clock frequency of 250 MHz. However, the decoder architecture is confined to time-invariant LDPCCCs and cannot be easily applied to time-varying codes which have a better error performance.

A register-based decoder architecture attaining up to 175 Mb/s throughput was proposed. The architecture successfully implements a pipeline decoder of ten processing units, but its register intensive architecture has limited its power efficiency. Later, a low-cost low-power memory-based decoder architecture that uses a single decoding processor was proposed. On one hand, the serial node operation uses a small portion of the field-programmable gate array (FPGA) resources. On the other hand, such a design has significant limitation on the achievable throughput. The memory-based design with parallel node operations have led to a substantial improvement on throughput. The high throughput under these designs, however, is achieved at the cost of a complicated shuffle/exchange-type switching network.

Previously proposed LDPCCC decoder architectures mainly handle random time-varying LDPCCCs. In recent literature, LDPCCCs of regular structures have attracted considerable interest. The construction of LDPCCC based on circulant matrices have been investigated. A lower bound of the free distance for unterminated protograph-based LDPCCC was analyzed and the free distance growth rates was shown to exceed the minimum distance growth rates of the corresponding LDPC block codes. Based on the free distance analysis, the average trapping set enumerators for the ensembles of protograph based LDPCCC was obtained. Later, it was observed that the decoding thresholds of asymptotically good irregular and regular LDPC codes formed by terminating the protograph based LDPCCC can approach the optimal maximum a posteriori (MAP) decoding thresholds of the corresponding LDPC block code ensembles on binary erasure channels (BEC) as the terminating length increases. The same observation is recently generalized to additive white Gaussian noise (AWGN) channels.

SUMMARY OF THE INVENTION

In a first preferred aspect, there is provided a Low-Density Parity-Check Convolutional Code (LPDCCC) decoder for partial parallel decoding of low-density parity-check convolutional codes, the decoder comprising:
  a plurality of pipeline processors to receive channel messages and edge-messages; each processor having:
    a plurality of block processing units (BPUs), each BPU having a plurality of check node processors (CNPs) to process check nodes that enter into the processor and a plurality of variable node processors (VNPs) to process variable nodes that are about to leave the processor; and
    a plurality of Random Access Memory (RAM) blocks for dynamic message storage of the channel messages and the edge-messages;
  wherein in each processor, the VNPs are directly connected to corresponding RAM blocks, and the CNPs are directly connected to corresponding RAM blocks such that the connections from the VNPs and CNPs to the corresponding RAM blocks are pre-defined and fixed according to a parity-check matrix of an unterminated time-varying periodic LDPCCC.

RAM blocks of different processors may be combined into a plurality larger RAM blocks such that each larger RAM block has a RAM block from each processor.

Each larger RAM block may have an address controller.

At least two larger RAM blocks may share the same address controller.

The address controller may be a counter that is incremented by one after every stage of decoding the LPDCCC.

The CNP may be a look-up table tree.

The messages processed by the CNP and from the VNP may be updated in the same stage using a shifting operation such that updated messages from the VNP and the channel messages associated with the updated variable nodes are directly output to the next processor.

A portion of updated messages from the CNP are not processed by the VNP and may be written to local memories.

The edge-message may be a check-to-variable message or variable-to-check message.

The messages may be quantized in a few bits to reduce complexity.

The VNP may be an adding operation using an adder tree.

The decoder may be implemented on a field-programmable gate array (FPGA) or an Application-Specific Integrated Circuit (ASIC)

In a second aspect, there is provided a method for partial parallel decoding of Low-Density Parity-Check Convolutional Codes (LPDCCCs), the method comprising:
  receiving channel messages and edge-messages by a plurality of pipeline processors, and each processor having:
    a plurality of block processing units (BPUs),
  processing check nodes that enter into the processor by check node processors (CNPs) in each BPU;
  process variable nodes that are about to leave each processor by variable node processors (VNPs) in each BPU;
  dynamically storing the channel messages and the edge-messages in a plurality of Random Access Memory (RAM) blocks in each processor;
  directly connecting the VNPs to corresponding RAM blocks in each processor;
  directly connecting the CNPs to corresponding RAM blocks in each processor;
  wherein the connections from the VNPs and GNPs to the corresponding RAM blocks are pre-defined and fixed according to a parity-check matrix of an unterminated time-varying periodic LDPCCC.

The method may further comprise combining RAM blocks of different processors into a plurality larger RAM blocks such that each larger RAM block has a RAM block from each processor.

The LDPCCC decoder provided by the present invention provides a high data throughput and good error performance with low hardware complexity. For the same hardware complexity as other technologies, the present invention provides a high data throughput and/or better error correction capability. Alternatively, the present invention can achieve a lower hardware complexity for the same data throughput and error-correction capability.

Compared with the previous implementations of LDPCCC decoders, the present invention provides an efficient high-throughput LDPCCC decoder for high-rate LDPCCC codes that can achieve an error floor of lower than $10^{-13}$. Such codes are desirable in many applications, such as next-generation optical communications. A decoder architecture for protograph-based LDPCCC is provided, which has been implemented on an Altera Stratix FPGA. By taking advantage of the homogeneous operations of the pipeline processing units, the data-width in modern FPGA for data storage is used, attaining an information throughput up to 2.0 Gb/s with a running clock of 100 MHz. The FPGA simulation results show that the protograph-based LDPCCC has an excellent error performance, achieving an error floor of lower than $10^{13}$ at a signal-to-noise-ratio (SNR) of 3.55 dB. Moreover, its error performance is superior to its block code counterpart of the same throughput, the same processor complexity and the same memory requirement.

The present invention provides:
1) A novel dynamic memory storage mechanism with a simple address controller used in LDPCCC decoders;
2) A novel pipeline processing of different LDPCCCs with the same hardware; and
3) A novel check-node processor design.

The efficient dynamic memory storage mechanism with a simple address controller avoids the use of a complex shuffle switching network, which is inevitable in random time-varying LDPCCC implementations. In addition, the homogeneous operations of the pipeline processing units to increase the data throughput by a few times is taken advantage of.

The present invention can be readily applied in the next generation and future generations of long-haul optical communications, satellite communications, space communications and digital broadcasting. The present invention reduces the hardware complexity of the decoders for long-haul high-speed optical communication systems.

BRIEF DESCRIPTION OF THE DRAWINGS

An example of the invention will now be described with reference to the accompanying drawings, in which:

FIG. 2 is a diagram illustrating the construction of a protograph-based LPDCCC from a protograph matrix;

FIG. 7A is a diagram illustrating an example of RAM storage where z=4 and G=2;

FIG. 7B is a diagram of the dynamic storage of the edge-messages in the RAM storage of FIG. 7A at a first time instance;

FIG. 7C is a diagram of the dynamic storage of the edge-messages in the RAM storage of FIG. 7A at a second time instance;

FIG. 7D is a diagram of the dynamic storage of the edge-messages in the RAM storage of FIG. 7A at a third time instance;

DETAILED DESCRIPTION OF THE DRAWINGS

Figure 1:
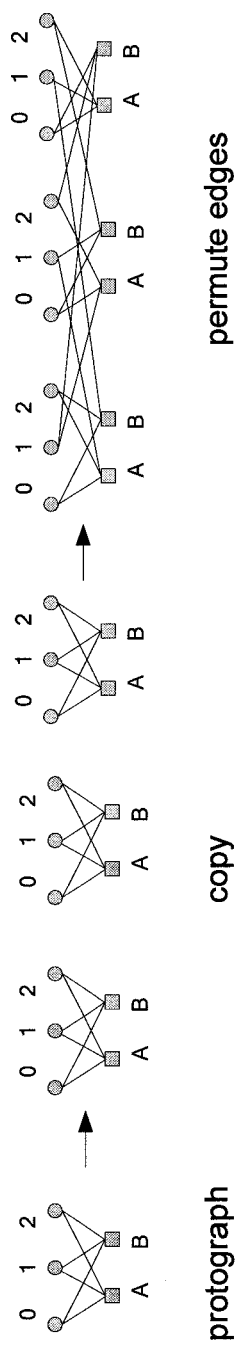
FIG. 1 is a diagram of an example of lifting (copying and permute) of the protograph by a factor 3.

Referring to FIG. 1, a decoder architecture 10 for low-density parity-check convolutional code (LDPCCC) based on protograph is provided. Specifically, the LDPCCC is derived from a well-designed quasi-cyclic LDPC block code. By making use of the quasi-cyclic structure, the LDPCCC decoder 10 adopts a dynamic message storage in the memory 12 and uses a simple address controller. The decoder 10 efficiently combines the memories 12 in the pipelining processors 11 into larger RAM blocks so as to take advantage of the data-width of embedded memory in a modern FPGA. A rate-5/6 LDPCCC has been implemented on an Altera Stratix FPGA. It displays an excellent error performance of lower than $10^{-13}$ at a signal-to-noise-ratio (SNR) of 3.55 dB and it can achieve up to 2.0 Gb/s information throughput with a clock frequency of 100 MHz.

The structure of LDPCCC and protograph-based LDPCCC is described. The parity-check matrix of an unterminated time-varying periodic LDPCCC is represented by:

$$H_{[0,\infty]} = \begin{bmatrix} H_0(0) & & & & \\ H_1(1) & H_0(1) & & & \\ \vdots & \vdots & & & \\ H_{m_s}(m_s) & H_{m_s-1}(m_s) & \cdots & H_0(m_s) & \\ & \ddots & \ddots & \ddots & \ddots \\ & & H_{m_s}(t) & H_{m_s-1}(t) & \cdots & H_0(t) \end{bmatrix}, \quad (1)$$

where $m_s$ is termed as the memory of the parity-check matrix and $H_i(t)$, where i=0, 1, ..., $m_s$, are (c−b)×c submatrices with full rank. A LPDCCC is periodic with period T if $H_i(t)=H_i(t+T)$ for all i=0, 1, ..., $m_s$. If T=1, the code is time-invariant; otherwise, it is time-varying. The code rate of the LPDCCC is R=b/c. A coded sequence $v_{[0,\infty]}=[v_0, v_1, \ldots,]$, where $v_t=\lfloor v_{t,1}, v_{t,2}, \ldots, v_{t,c} \rfloor$ satisfies $H_{[0,\infty]}v_{[0,\infty]}^T=0$ Given a $n_c \times n_v$ protograph matrix, a larger Tanner graph is obtained by first making z copies of the protograph and then permuting the edges.

Referring to FIG. 1, an example of lifting a 2×3 protograph matrix P by a factor of z=3 is illustrated with $$P = \begin{bmatrix} 1 & 1 & 1 \\ 1 & 1 & 1 \end{bmatrix}$$

This operation is equivalent to replacing the ones in a protograph matrix with z×z permutation matrices and the zeros with z×z zero matrices. If an entry in the protograph matrix is l with l>1, it will be replaced by a sum of l random permutation matrices. An ensemble of protograph-based LPDCCC can be constructed in a similar manner except that the protograph matrix needs to be unwrapped before the copy-and-permute operation. Suppose a protograph-based LDPC block code is created by lifting an $n_c \times n_v$ protograph matrix by a factor of z, the parity-check matrix for a LPDCCC is constructed in the following three steps:

1) Partition the $zn_c \times zn_v$ parity-check matrix $H^b$ as a M×M matrix, where M is the greatest common divisor of $n_c$ and $n_v$, i.e., $M = \gcd(n_c, n_v)$:

$$H^b = \begin{bmatrix} H^b_{1,1} & \cdots & H^b_{1,M} \\ \vdots & & \vdots \\ H^b_{M,1} & \cdots & H^b_{M,M} \end{bmatrix}, \quad (2)$$

where $H^b_{i,j}$ is a $$\frac{zn_c}{M} \times \frac{zn_v}{M}$$

matrix, for i, j=1, 2, ..., M.

2) Cut $H^b$ into $H^b_l$ and $H^b_u$ corresponding to the lower triangular part and upper triangular part of $H^b$, respectively. $H^b_l$ and $H^b_u$ are denoted as $$H^b_l = \begin{bmatrix} H^b_{1,1} & & & \\ H^b_{2,1} & H^b_{2,2} & & \\ \vdots & \vdots & \ddots & \\ H^b_{M,1} & H^b_{M,2} & \cdots & H^b_{M,M} \end{bmatrix}_{M \times M}$$

and $$H^b_u = \begin{bmatrix} H^b_{1,2} & \cdots & & H^b_{1,M} \\ & H^b_{2,3} & & H^b_{2,M} \\ & & \ddots & \vdots \\ & & & H^b_{M-1,M} \end{bmatrix}_{M \times M}.$$

3) Unwrap the parity-check matrix of the block code to obtain the parity-check matrix of LPDCCC in the form of (1):

$$H^\infty_{[0,\infty]} = \begin{bmatrix} H^b_l & & & \\ H^b_u & H^b_l & & \\ & H^b_u & H^b_l & \\ & & \ddots & \ddots \end{bmatrix}. \quad (3)$$

Referring to FIG. 2, the above construction process is illustrated. By comparing (1) and (3), it can be observed that the period of the derived protograph-based LPDCCC is T=M and the memory $m_s$ satisfies $M = m_s + 1$. It can also be observed that the relative positions between the variable nodes and the check nodes do not change, hence the girth of the derived LPDCCC is no less than that of the block code counterpart. Therefore, a large-girth LPDCCC is constructed by first carefully designing the permutation submatrices for a large-girth protograph-based LDPC block code, and then performing the unwrapping operation. For clarity of presentation, the focus is on the case where the variable nodes and the check nodes in the protograph are connected by non-parallel edges, an analogous decoder architecture tailored to more general protograph-based codes can also be designed though.

The decoding algorithm for LPDCCCC is described. LPDCCC has an inherent pipeline decoding process. The pipeline decoder 10 consists of I processors 11, separated by $c(m_s+1)$ code symbols, with I being the maximum number of decoding iterations. At the start of each decoding step, the channel messages 8 along with the variable to-check (V2C) messages 7 associated with c variable nodes denoted by $v_{t0} = \lfloor v_{t0,1}, v_{t0,2}, \ldots, v_{t0,c} \rfloor$ enter into the first processor 11A of the decoder 10. The messages associated with the variable nodes $v_{t0-i(m_s+1)} = \lfloor v_{t0-i(m_s+1),1}, v_{t0-i(m_s+1),2}, \ldots, v_{t0-i(m_s+1),c} \rfloor$ are shifted from the i-th processor 11 to the (i+1)-th processor, where i=1, 2, ..., i-1. Each processor 11 first updates c−b check nodes $u_{t0} = \lfloor u_{t0,1}, u_{t0,2}, \ldots, u_{t0,c-b} \rfloor$ corresponding to the t-th block row of $H_{[0,\infty]}$ in (1) as follows, $$\alpha_{mn} = 2\tanh^{-1}\left(\prod_{n' \in N(m)\setminus n} \tanh\left(\frac{\beta_{mn'}}{2}\right)\right), \quad (4)$$

where $\alpha_{mn}$ is the check-to-variable (C2V) message from check node m to variable node n and $\beta_{mn}$ is the variable-to-check (V2C) message from variable node n to check node m; N(m)\n is the set of variable nodes connected to check node m and N(m)\n is the set N(m) excluding variable node n.

Then, the other processors 11 in the decoder 10 perform variable node updating and makes hard decision on c variable nodes $v_{t0-m_s} = \lfloor v_{t0-m_s,1}, v_{t0-m_s,2}, \ldots, v_{t0-m_s,c} \rfloor$ based on the a posteriori probability (APP). The variable-to-check messages and APP are calculated as follows, $$\beta_{mn} = \lambda_n + \sum_{m' \in M(n)\setminus m} \alpha_{m'n}, \quad (5)$$

and $$\beta_n = \lambda_n + \sum_{m' \in M(n)} \alpha_{m'n}, \quad (6)$$

where $\lambda_n$ is the channel message for variable node n, $\beta_n$ is the APP message for variable node n; M(n) is the set of check nodes connected to variable node n, and M(n)\m is the set M(n) excluding check node m.

The message shifting, check node processing and variable node processing consist of a complete decoding step. After that, the next decoding step starts and the updated variable-to-check messages as well as the channel messages associated with the newly updated variable nodes will be shifted to the next processor 11. As a result, after an initial delay of $(m_s+1)I$ decoding steps, the decoded code bits 9 begin to be output continuously from the last processor 11B in the decoder 10.

The decoder architecture 10 is now described. The architecture design of the decoder 10 consists of a high-throughput decoder requiring parallel processing of the LPDCCC. A partially parallel decoder architecture 10 that utilizes parallelization on both the node level and the iteration level is described. The row number and column number of the submatrices $H^b_{i,j}$ in (2) (corresponding to $H_i(t)$ in (1)) is $c-b=zn_c/M$ and $c=zn_v/M$, respectively.

Figure 3:
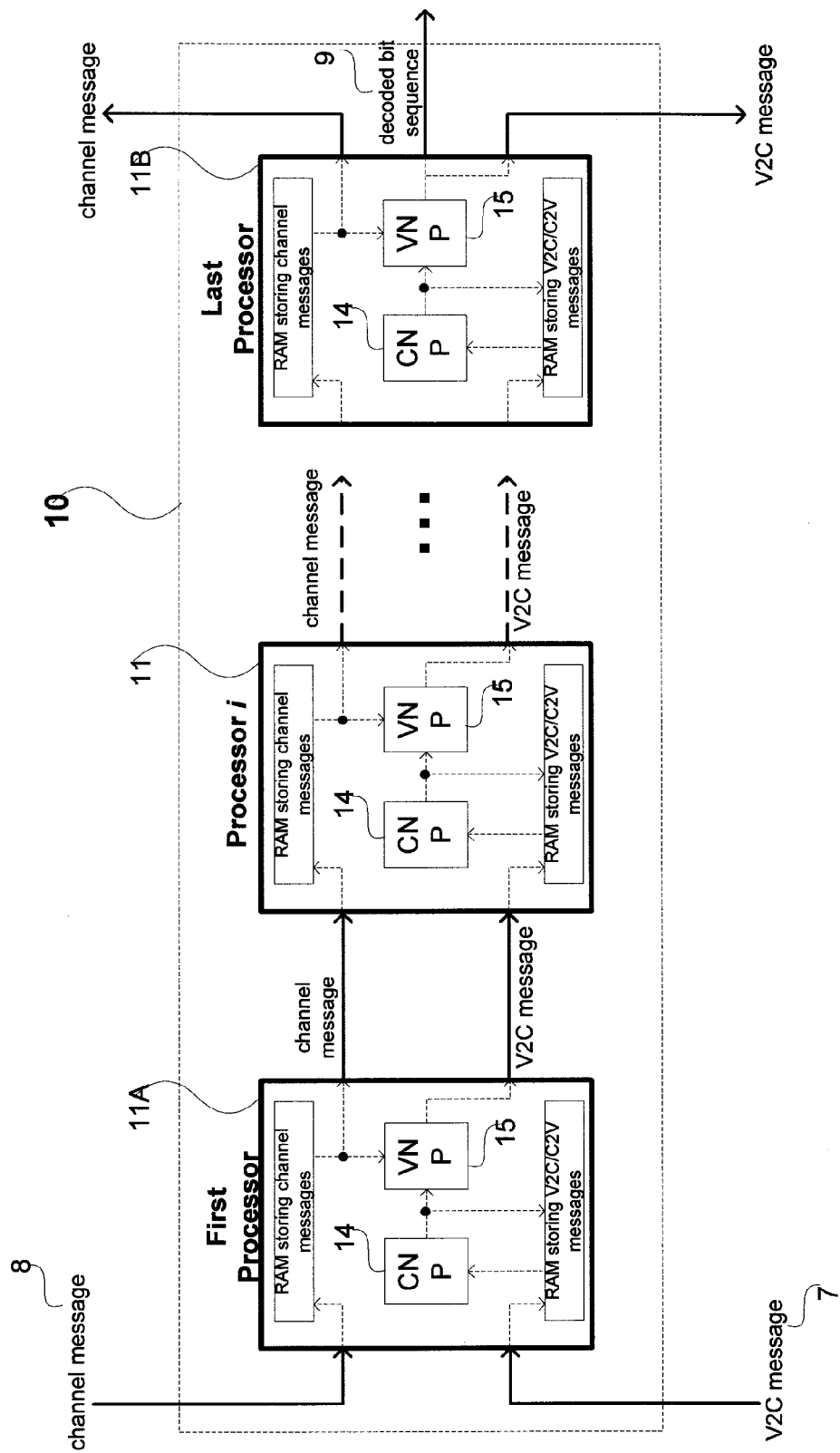
FIG. 3 is a block diagram of an LPDCCC decoder comprising a plurality of pipeline processors.
Figure 3A:
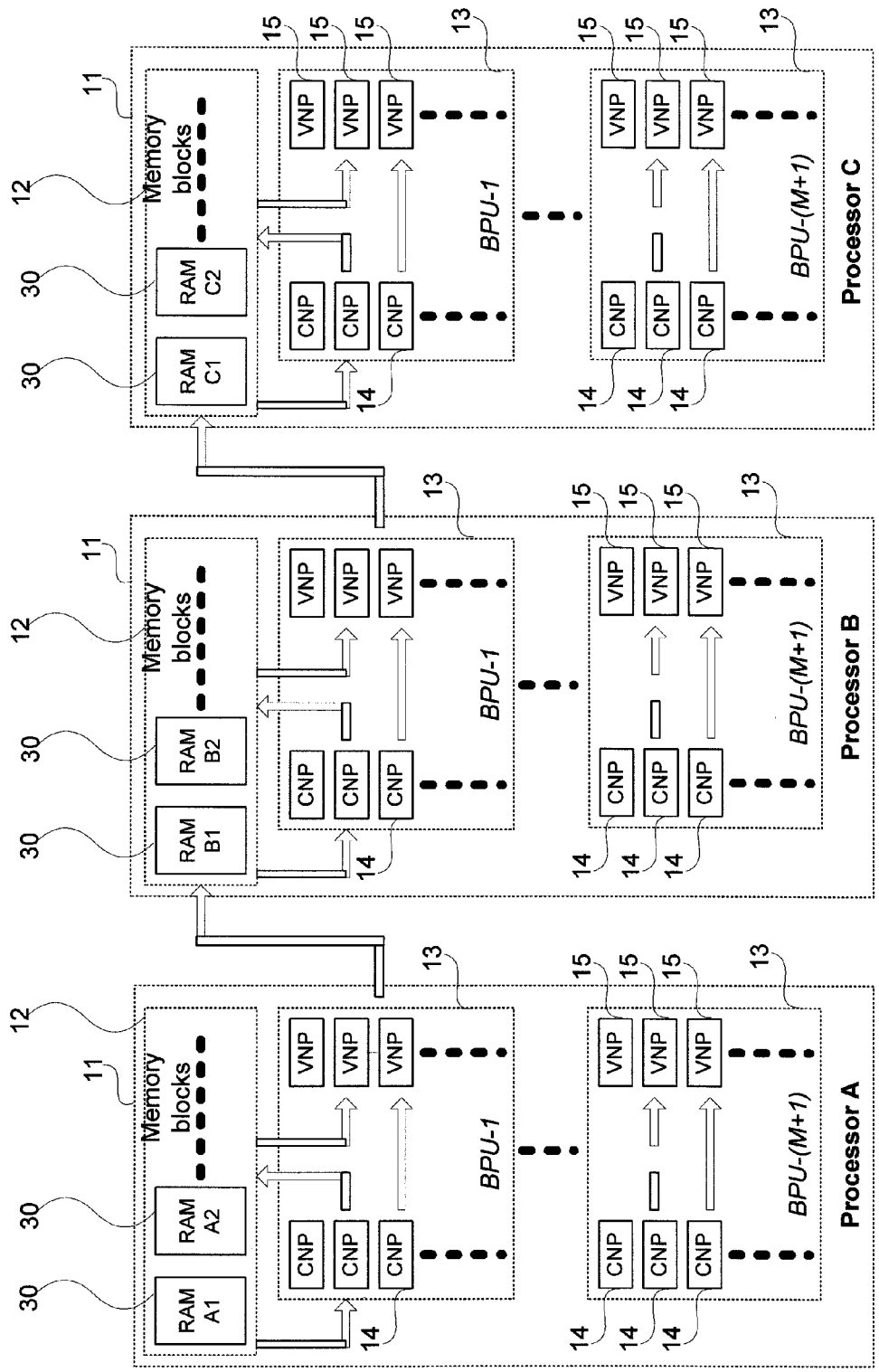
FIG. 3A is a block diagram of processors A, B and C in the LPDCCC decoder of FIG. 3.

Referring to FIGS. 3 and 3A, the decoder 10 comprises a plurality of pipeline processors 11. Each processor 11 contains a number of RAM blocks 30 and a block processing units (BPUs) 13. The BPUs 13 include a number of check-node processors (CNPs) 14 to process check-nodes and a number of variable-node processors (VNPs) 15 to process variable-nodes. The variable-node to check-node (V2C) messages should be first available in the RAM blocks 30 of the processor 11. The CNPs 14 process check-nodes by reading the variable-node to check-node (V2C) messages from the local RAM blocks 30. The resultant check-node to variable-node (C2V) messages are either stored into the local RAM blocks 30 or passed to the VNPs 15. The VNPs 15 process variable-nodes by either reading the check-node to variable-node (C2V) messages from the CNPs 14 or local RAM blocks 30. At the end, the resultant variable-node to check-node (V2C) messages are stored into the RAM blocks 30 of the next processor 11.

The connections between the VNPs 15 and the RAM blocks 30, and the connection between the CNPs 14 and the RAM blocks 30 are pre-defined and fixed according to the parity-check matrix of an unterminated time-varying periodic LDPCCC, respectively. A fixed connection means that the CNPs 14 and the RAM blocks 30, and the VNPs 15 and the RAM blocks 30 are connected directly without an additional switching network/complicated shuffle switching network. There is a hard wired connection between CNPs 14 and the RAM blocks 30, and a hard wired connection between VNPs 15 and the RAM blocks 30. Having fixed connections between the CNPs 14 to the RAM blocks 30 and fixed connections between the VNPs 15 to the RAM blocks 30 avoids using a switching network. The advantage of avoiding use of a switching network is that the same throughput and error performance can be achieved with a lower hardware complexity. The power consumption and the manufacturing cost of the system can be reduced accordingly.

In addition, a same memory slot can be used to store both the check-node to variable-node message (C2V) and the variable-node to check-node (V2C) message of the same edge because either one of these two messages is required to be stored at any instance. The total memory size can be reduced by half.

The decoder architecture 10 consists of I processors 11 where I is the maximum number of decoding iterations. Since the memory of a protograph-based LPDCCC constructed using the previously described method is $M_s=M-1$, the variable nodes and check nodes in each processor 11 are separated by a maximum of M−1 time instants. Assume the c−b check nodes and the c variable nodes that last enter into the processor 11 are denoted by $u_{t0}=\lfloor u_{t0,1}, u_{t0,2}, \ldots, u_{t0,c-b}\rfloor$ and $v_{t0}\lfloor v_{t0,1}, v_{t0,2}, \ldots, v_{t0,c}\rfloor$, respectively, then the check nodes and variable nodes that are about to leave the processor 11 are $u_{t0-M+1}=\lfloor u_{t0-M+1,1}, u_{t0-M+1,2}, \ldots u_{t0-M+1,c}\rfloor$ and $v_{t0-M+1}=\lfloor v_{t0-M+1,1}, v_{t0-M+1,2}, \ldots v_{t0-M+1,c}\rfloor$ respectively. At each decoding step, a block processing unit (BPU) 13 is responsible for processing the check nodes that just enter into a processor 11, i.e., $u_{t0}$ and the variable nodes that are about to leave the processor 11, i.e., $v_{t0-m+1}$. Referring to FIG. 3, M BPUs 13 are used in one processor 11. Although only one BPU 13 is being used at each decoding step, using M BPUs 13 can avoid the complexity of routing the messages and it will described later that using multiple BPUs 13 can also facilitate the pipeline of up to M distinct codewords.

At the start of each decoding step, c−b check nodes are to be processed. The c−b check nodes are divided into G groups and a complete decoding step is divided into G stages. At the i-th stage, i=1, 2, . . . , G, (c−b)/G check nodes $\lfloor u_{t0,(i-1)(c-b)/G+1}, u_{t0,(i-1)(c-b)/G+2}, \ldots u_{t0,i(c-b)/G}\rfloor$ are processed in parallel. The variable-to-check (V2C) messages expressed in the sign-and-magnitude format are input to a group of (c−b)/G check node processors (CNPs) 14. Among the resulting check-to-variable (C2V) messages, those between the check nodes in $u_{t0}$ and the variable nodes not in the set $v_{t0-m+1}$ will be written to the local RAMs, waiting to be further processed by other BPUs. On the other hand, the updated check-to-variable messages between the check nodes in $u_o$ and the variable nodes in $v_{t0-m+1}$ are converted to the format of 2's complement before being processed by the variable node processor (VNP) 15. Since each check node is connected with totally c/z variable nodes in $v_{t0-M+1}$, (c−b/G)*(c/z)=c(c−b)/Gz variable nodes in $v_{t0-M+1}$ are connected to the newly updated check nodes and c(c−b)/Gz VNPs 15 are needed in one BPU 13. Finally, the updated variable-to-check messages are converted back to the format of sign-and-magnitude and they will be shifted to the next processor 11 together with their associated channel messages in the next decoding step.

In the BPUs 13, the CNPs 14 update the check nodes according to (4). However, in practical implementations the messages are quantized in a few bits to reduce the complexity. In the implementation of one embodiment, a four-bit quantization is adopted, where the quantization step is derived based on density evolution and differential evolution. Empirical results show that its error performance is only 0.1 dB worse than the floating-point sum-product algorithm. The CNP 14 with quantization can be implemented by first pairing up the input messages 41, 42, 43, 44 and then calculating the extrinsic messages excluding the input message 41, 42, 43, 44 itself. More specifically, suppose the variable nodes connected to check node m is listed as $[n_1, n_2, \ldots, n_d]$, the corresponding input messages 41, 42, 43, 44 being $[s_1, s_2, \ldots, s_d]$. The updated check-to-variable message 45 to variable node $n_i$ is calculated as $$Q\{\infty_{mn_i}\}=O(s_{i-},s_{i+}), \quad (7)$$

where $$O(i, j) = Q\left\{2\tanh^{-1}\left(\tanh\frac{i}{2}\tanh\frac{j}{2}\right)\right\},$$

Figure 4:
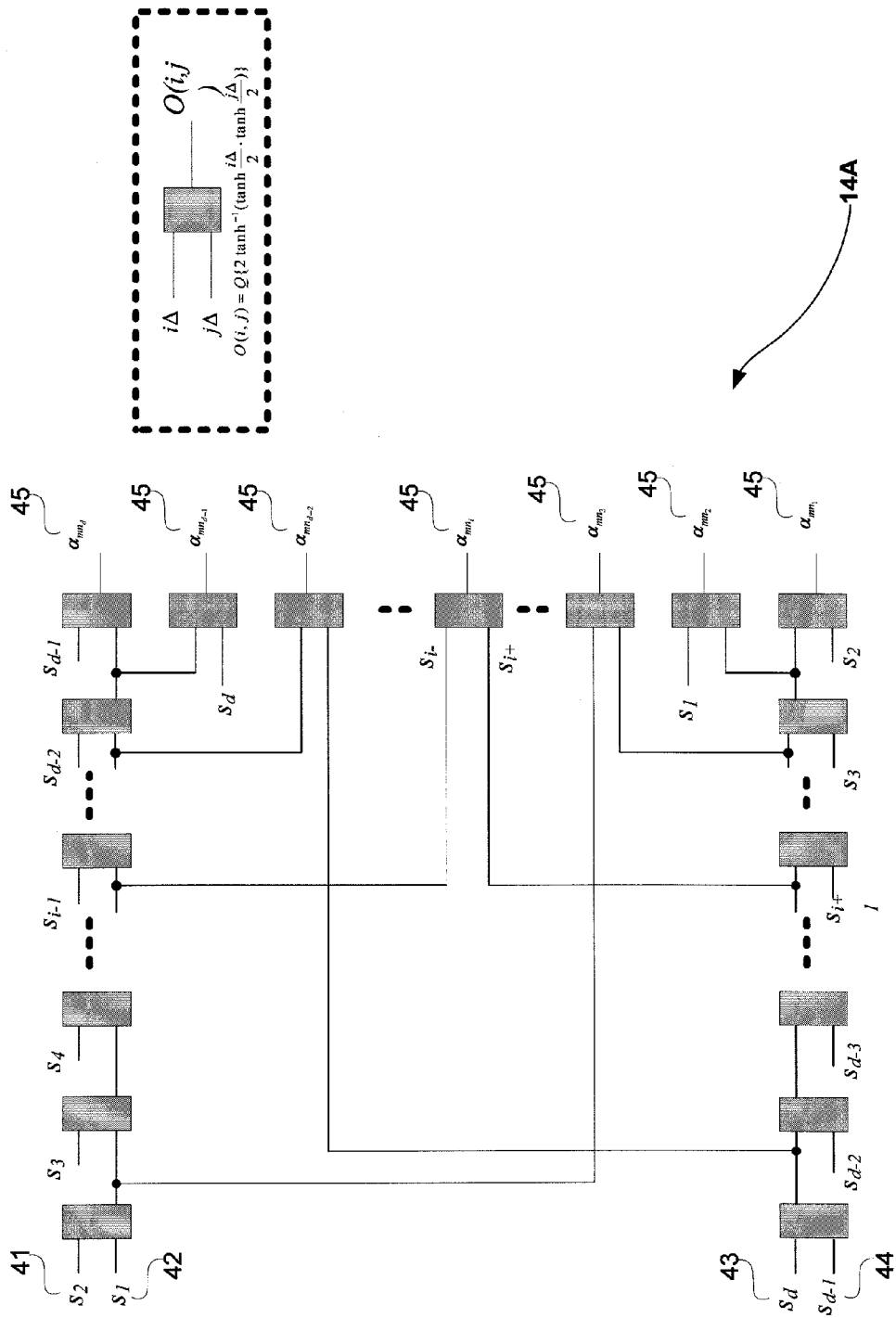
FIG. 4 is a diagram illustrating an implementation of check node processor (CNP) using a tree of look-up tables.

$s_{i-}=O(O(O(s_1, s_2), s_3), \ldots s_{i-1})$, and $s_{i+}=O(O(O(s_d, s_{d-1}), s_{d-2}), \ldots, s_{i+1})$. (7) can be implemented based on a simple look-up table tree 14A as shown in FIG. 4. The look-up tables are used to compute $O(s_1, s_2)$, $O(O(s_1, s_2), s_3)$ and $O(O(O(s_1, s_2), s_3), s_4)$, etc. . . . , while last column of the look-up tables is used to compute $Q\{\infty_{mn_i}\}$. The VNP 15 is basically an adding operation which can be implemented using an adder tree.

Figure 3B:
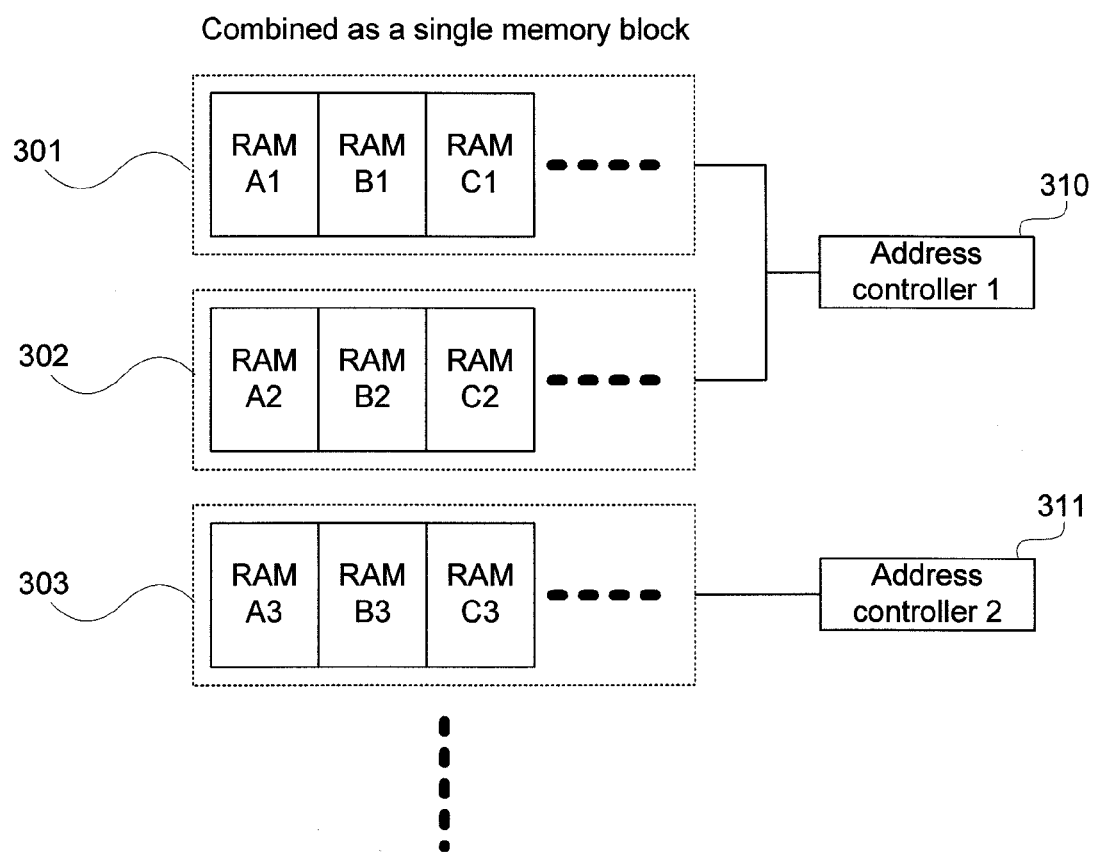
FIG. 3B is a block diagram of combining RAM blocks of processors A, B and C of FIG. 3A into larger RAM blocks.

The memory storage 12 is described. Referring back to FIG. 3A, the small RAM blocks 30 in the memory storage 12 of each processor 11 can be combined into larger RAM blocks 301, 302, 303 as illustrated in FIG. 3B. For example, processor A has RAM blocks A1, A2, A3, etc. Processor B has RAM blocks B1, B2, B3, etc. Processor C has RAM blocks C1, C2, C3, etc. RAM blocks A1, B1 and C1 of all three processors 11 are combined into a larger RAM block 301. RAM blocks A2, B2 and C2 of all three processors 11 are combined into a larger RAM block 302. RAM blocks A3, B3 and C3 of all three processors 11 are combined into a larger RAM block 303. Combining the small RAM blocks 30 in each processor 11 into a larger RAM block takes advantage of the data-width of embedded memory in a modern FPGA. This helps to utilize the embedded memory of the FPGA more efficiently. In addition, a small number of large-sized RAM blocks consume a lower number of logic gates (lower hardware complexity) than a larger number of small sized memory blocks with the same size of storage. The power consumption and the manufacturing cost of the system can be reduced accordingly.

Also, some address controllers can be shared by multiple RAM blocks because the address sequence of different RAM blocks may be the same. For example, larger RAM blocks 301, 302 containing smaller RAM blocks A1, B1, C1, A2, B2 and C2 share the same address controller 310. Sharing the same address controller 301 helps to reduce the total number of address controllers. By reducing the number of address controllers, the hardware complexity of the system can be lower. The power consumption and the manufacturing cost of the system can be reduced accordingly. The address controller may be a counter computing the address for the memory. If it not possible for multiple memory blocks to share the address controller, then there is one address controller 311 for each larger RAM block 303.

In one embodiment, it is assumed that $M=n_c$, hence $c-b=z$ and $c=zn_v/n_c$. It is also assumed that each entry in the original protograph-matrix (1) is one. Suppose the decoding step is divided into G stages with $z/G$ check nodes being processed in parallel. Consider the $t_0$-th block row in $H_{[0,\infty]}^{cc}$ as shown in FIG. 2, it consists of $1 \times (n_v/n_c)$ submatrices of size z which correspond to z check nodes and $zn_v/n_c$ variable nodes in the Tanner graph. Suppose $u_{r0}$ and $v_{r0}$ just enter a processor 11 and $u_{r0-M+1}$ and $v_{r0-M+1}$ are about to be shifted to the next processor 11. The memory requirement is explained below.

The storing of check-to-variable/variable-to-check messages is described. The check nodes are denoted by $u_{r0}=\lfloor u_{r0,1}, u_{r0,1}, \ldots, u_{r0,z} \rfloor$ and divide them into G groups with the i-th group being denoted by $\lfloor u_{r0,1+(i-1)z/G}, u_{r0,2+(i-1)z/G}, \ldots, u_{r0,z+(i-1)z/G} \rfloor$, $i=1, 2, \ldots, G$. As explained previously, at the i-th stage of the decoding step for processing $u_{r0}$, $\lfloor u_{r0,1+(i-1)z/G}, u_{r0,2+(i-1)z/G}, \ldots, u_{r0,z+(i-1)z/G} \rfloor$ are processed in parallel. Therefore in order to avoid collisions of memory access, $z/G$ different RAMs are needed to store the messages of one edge incident on the set of check nodes. From the construction of the protograph-based LPDCCC, each check node has a regular degree of $n_v$. Therefore, totally $zn_v/G$ RAMs are needed to store the edge-messages passing between the check nodes in $u_{r0}$ and their connected variable nodes. Each processor 11 has M sets of such check nodes, i.e., $u_{r0}, u_{r0-1}, \ldots, u_{r0-M+1}$. In summary, in one processor 11 totally $zn_vM/G$ RAMs are allocated to store edge-messages, i.e., check-to-variable or variable-to-check messages. The data-depth and data-width of the RAMs equal to G and the number of quantization bits, respectively.

The storing of channel messages is described: In terms of channel messages, the memory storage mechanism is similar. The set of z variable nodes corresponding to every submatrix are first divided into G groups; then $z/G$ RAMs, each of which having G entries, are allocated to store their channel messages. The variable nodes in $v_{r0}$ correspond to $n_v/n_c$ submatrices and each processor 11 has variable nodes $v_{r0}$, $v_{r0-1}, \ldots, v_{r0-M+1}$. In summary, in one processor 11 totally $zn_vM/n_cG$ RAMs are allocated to store the channel messages. The data-depth and data-width of the RAMs equal to G and the number of quantization bits, respectively.

For a general case that M is not necessarily equal to $n_c$, in one processor 11 $zn_cn_v/G$ RAMs store edge-messages and $zn_vM/n_cG$ RAMs store channel messages. In modern FPGAs, the total number of internal memory bits are sufficient to store the messages for codes of a reasonable length and for a reasonable number of iterations. However, the number of RAM blocks is usually insufficient. Note that the operations of the pipeline processors 11 are identical, the connections between the RAMs and the BPUs are the same and the addresses of accessing the RAMs are the same. By taking advantage of the homogeneity of the processors 11, the RAMs in different processors 11 are combined into one large RAM block. In particular, for the RAMs handling edge-messages, the I sets of $zn_cn_v/G$ RAM blocks distributed in I processors 11 are combined into one set of $zn_cn_v/G$ RAM blocks. Similar for the RAMs storing channel messages, I sets of $zn_vM/n_cG$ RAM blocks are combined into one set of $zn_vM/n_cG$ RAM blocks. The data-depth of the RAMs remains the same, while the data-width becomes I times wider. Note that the memory combination is a unique feature of LPDCCC and is not boasted by LDPC block codes. For block codes, sophisticated memory optimization has been proposed in but it involves a high complexity and memory efficiency is achieved at the cost of lower throughput.

Another advantage of such memory storage mechanism is that the address controller is a simple counter incrementing by one at every cycle, thanks to the quasi-cyclic structure. Specifically, at the start of each decoding step, the addresses of accessing the RAMs are initialized based on the parity-check matrix $H_{[0,\infty]}^{cc}$. As the decoding process proceeds, the addresses are incremented by one after every stage, until G stages complete.

Figure 5:
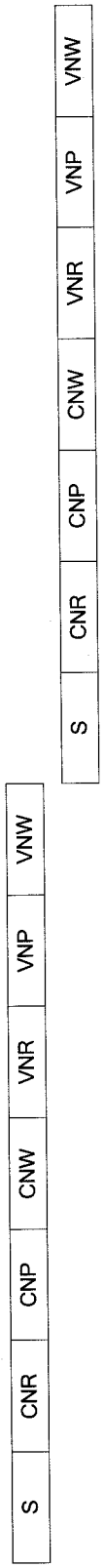
FIG. 5 is a diagram illustrating conventional pipelining.

Pipeline scheduling is described. Referring to FIG. 5, conventional LPDCCC decoder architectures adopts a pipeline design. Each processor 11 sequentially does the following: shift the messages in, update check nodes, write data to memories, input messages to VNP and update variable nodes. This pipeline schedule only utilizes pipelining on the iteration level following the standard decoding process.

A more efficient pipeline scheduling based on the dynamic memory storage structure is provided. The pipeline schedule for a single codeword is described. Instead of writing the updated messages from CNP 14 and those from VNP 15 in two separate stages, they are combined with the shifting operation. The updated messages from VNP 15 and the channel messages associated with the updating variable nodes are directly output to the next processor 11, which completes the writing and shifting operations at the same time. Since some of the updated messages from CNP 14 need not be processed by VNP 15, they are written to the local memories at the same time. Note that the memory locations into which the messages are shifted are exactly those storing the original messages loaded by the BPU 13. Therefore, there would not occur memory collisions during the process.

It can also be inferred from this process that the types of messages stored in the memories are dynamically changing. The messages associated with check node $u_{r0}$ are all variable-to-check messages by the time $u_{r0}$ first enter into the processor 11 and are ready to be processed by CNP 14. After each decoding step, parts of the messages are substituted by the updated variable-to-check messages from the previous processor 11. When M decoding steps are completed, all the check-to-variable messages originally associated with check node $u_{r0}$ will be substituted again by variable-to-check messages, but now they are messages for check node $u_{r0-M+1}$ and ready for CNP 14 in a new around of decoding.

Figure 6A:
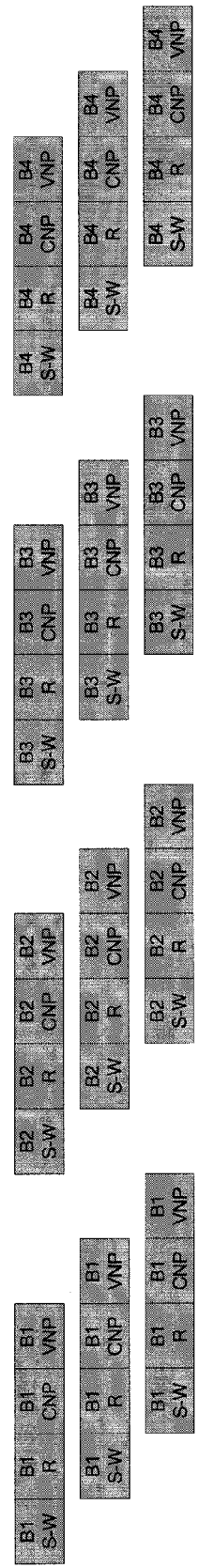
FIG. 6A is a diagram illustrating a single-codeword pipeline.
Figure 6B:
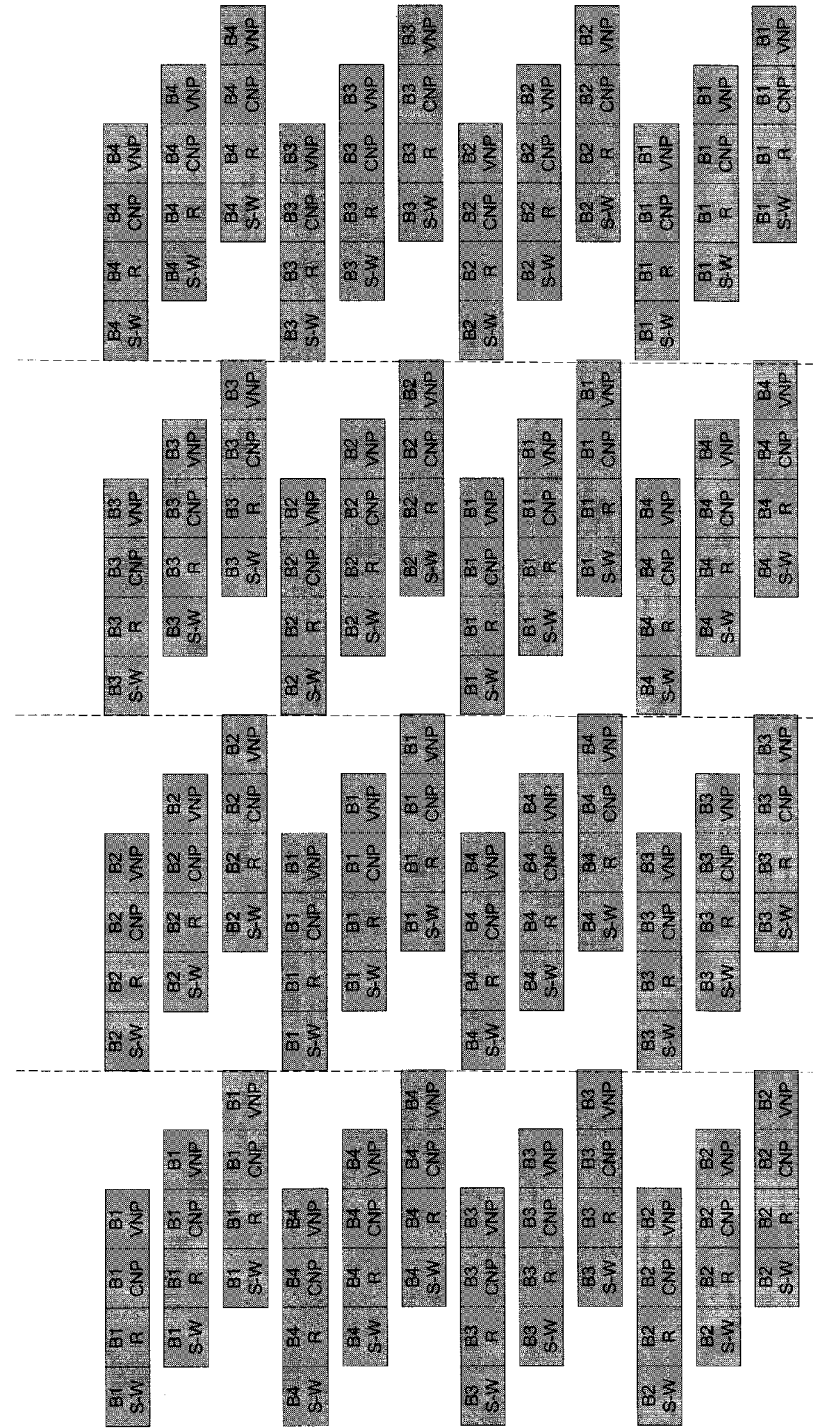
FIG. 6B is a diagram illustrating a multiple-codeword pipeline.

FIG. 6A illustrates the pipeline for a single codeword assuming G=3 and M=4. Comparing FIG. 5 and FIG. 6A, it can observed that decoding a group of check nodes only takes 4/7 of the time cost in conventional scheduling. The homogeniety of the pipeline processors 11 also facilitates a pipeline processing of multiple codewords. As shown in FIG. 6A, of the single-codeword case, the processing time of different BPUs are separate in the sense that while one BPU is processing, the other BPUs remain idle. To further increase the throughput, the other BPUs are scheduled to process other codewords. Since the total blocks in a processor 11 is M, a maximum of M different codewords are incorporated in one processor 11, letting $BPU_i$ process codeword-i, for i=1, 2, ..., M. Depending on how many codewords are incorporated, the throughput can be increased substantially by a maximum factor of M at the cost of additional memory storage and the additional hardware complexity of the BPUs. FIG. 6B illustrates the pipeline schedule for four codewords with G=3 and M=4.

Using the described pipeline schedule, the throughput of the decoder is $(n_v-n_c)z/M$ information bits for every G+d cycles, where d is the time delay for each pipeline stage such that G+d cycles are used by one BPU. As more decoding stages are divided, i.e., G increases, the throughput tends to $(n_v-n_c)zf/MG$ bits/s with a running clock of f Hz.

An illustrative example of the RAM storage and decoding process is described. Consider a LPDCCCC with G=2 and z=4 based on a $(n_c=2) \times (n_v=4)$ protograph matrix:

$$P = \begin{bmatrix} 1 & 1 & 1 & 1 \\ 1 & 1 & 1 & 1 \end{bmatrix}$$

Figure 7A:
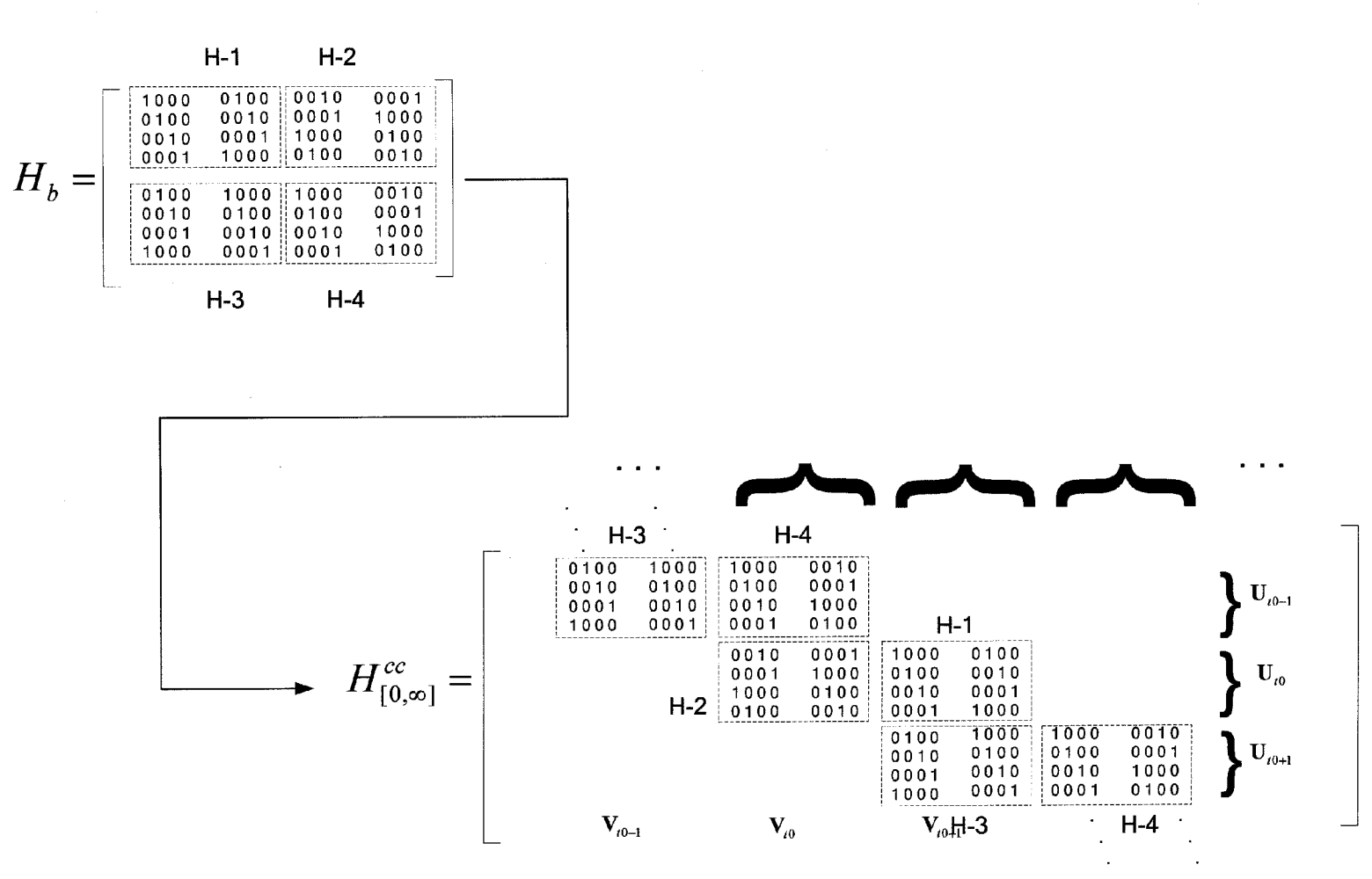

Since $M=\gcd(n_c, n_v)=2$, each processor 11 has M=2 BPUs. In each processor 11, $zn_cn_v/MG=8$ RAMs are dedicated to store edge-messages and $zn_v/MG=4$ RAMs are dedicated to store channel messages. Assume that the check nodes $u_{r0}=\lfloor u_{r0,1}, u_{r0,2}, \ldots, u_{r0,4} \rfloor$ just enter into the processor 11 and variable nodes $v_{r0-1}=\lfloor v_{r0-1,1}, v_{r0-1,2}, \ldots, u_{r0-1,8} \rfloor$ are about to leave. The check nodes $u_{r0}=\lfloor u_{r0,1}, u_{r0,2}, \ldots, u_{r0,4} \rfloor$ are divided (101) into G=2 groups. The decoding step of processing $BPU_i$, i=1, 2, is divided (100) into G=2 stages. Referring to FIG. 7A, the dynamic storage of the edge-messages in the RAMs at different time instances is illustrated.

Firstly, the top half of FIG. 7B shows the RAM storage at the start of processing (102) check node $u_{r0}$ and variable node $v_{r0-1}$ by $BPU_1$. It can be seen that RAM 1 to 8 store (103) the variable-to-check messages for check node $u_{r0}$ ready to be processed. RAM 13 to 16 store (104) the check-to-variable messages updated for check node $u_{r0-1}$ in the previous decoding step by $BPU_2$. RAM 9 to 12 store (105) the variable-to-check messages that are newly updated in the previous decoding step and shifted from the previous processor 11.

Secondly, the bottom half of FIG. 7B shows the RAM storage after the first stage of $BPU_1$ processing. At the first stage, $BPU_1$ will process check nodes $u_{r0,1}$ and $u_{r0,2}$ and their connected variable nodes in $v_{r0-1}$, e.g., $\lfloor v_{r0-1,3}, v_{r0-1,4}, v_{r0-1,5}, v_{r0-1,8} \rfloor$. CNP 14 reads (106) the variable-to-check messages from the first entries located in RAM 1 to 8. The newly updated check-to-variable messages between check node $u_{r0}$ and variable node $v_{r0}$ from CNP 14 are input (107) to the first entries in RAM 1 to 4, i.e., where the check-to-variable messages are read. While the newly updated check-to-variable messages between check node $u_{r0}$ and variable node $v_{r0-1}$ are input (108) to the VNP 15 and the resulting variable-to-check messages are shifted (109) into the next processor 11. As a result, the updated variable-to-check messages between variable node $v_{r0+1}$ and check node $u_{r0+2}$ are written (110) to RAM 5 to 8 and those between variable node $v_{r0+1}$ and check node $u_{r0+1}$ are written to RAM 13 to 16.

Thirdly, the top half of FIG. 7C shows the RAMs after the second stage of $BPU_1$ processing. At the second stage, $BPU_1$ will process check nodes $u_{r0,3}$ and $u_{r0,4}$ and their connected variable nodes in $v_{r0-1}$, e.g., $\lfloor v_{r0-1,1}, v_{r0-1,2}, v_{r0-1,6}, v_{r0-1,7} \rfloor$. CNP 14 reads the variable-to-check messages from the second entries located in RAM 1 to 8. The newly updated check-to-variable messages between check node $u_{r0}$ and variable node $v_{r0}$ from CNP 14 are input to the second entries in RAM 1 to 4, where the check-to-variable messages are read. While the newly updated check-to-variable messages between check node $u_{r0}$ and variable node $v_{r0-1}$ are input to the VNP 15 and the resulting variable-to-check messages are shifted into the next processor 11. As a result, the updated variable-to-check messages between variable node $v_{r0+1}$ and check node $u_{r0+2}$ are written to RAM 5 to 8 and those between variable node $v_{r0+1}$ and check node $u_{r0+1}$ are written to RAM 13 to 16. 4. The bottom half of FIG. 7C shows that the RAM updating at the decoding step of $BPU_2$ is analogous to the description (2) and (3).

Referring to FIG. 7D, after the second stage of $BPU_2$, RAM 1 to 8 will have the variable-to-check messages ready for check node $u_{r0+2}$ and their connected variable nodes in $v_{r0+1}$. The RAM storage is similar to that in (1) with the time instances incrementing by M=2. A new round of $BPU_1$ updating will follow according to (2) and (3).

After the address controller is initialized at the start of G stages, the read/write address of accessing the RAMs are simply incremented by 1.

The protograph-based LPDCCC decoder is implemented on Altera Stratix IV field-programmable gate array (FPGA). The Bit-Error Rate (BER) performance for LPDCCCs of different sizes based on a 4×24 protograph matrix with 1 in each entry is simulated. The permutation indices in the block code counterpart are chosen such that the girth is 8.

Figure 8:
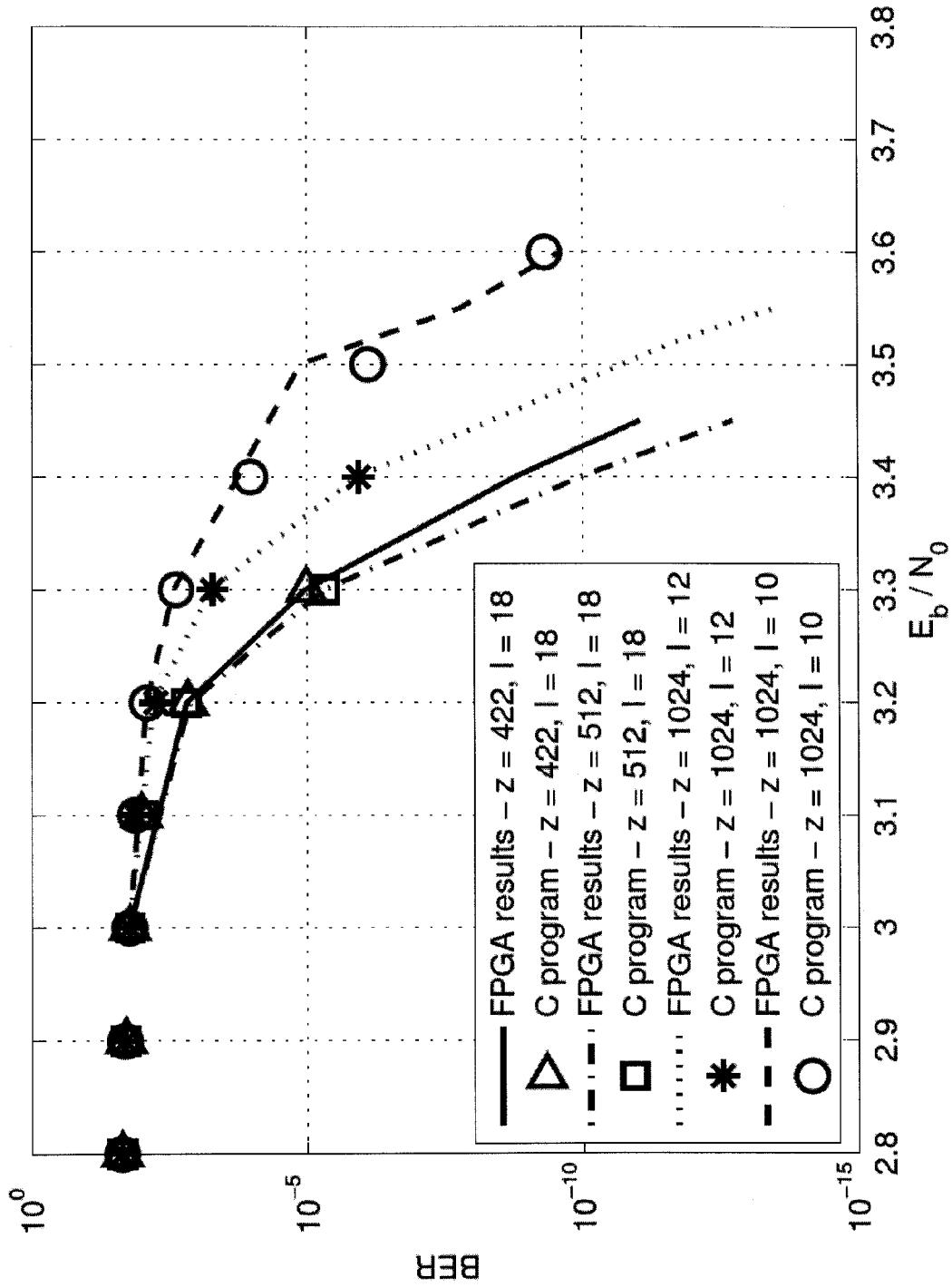
FIG. 8 is a chart illustrating BER results of an FPGA simulation and C program.
Figure 9:
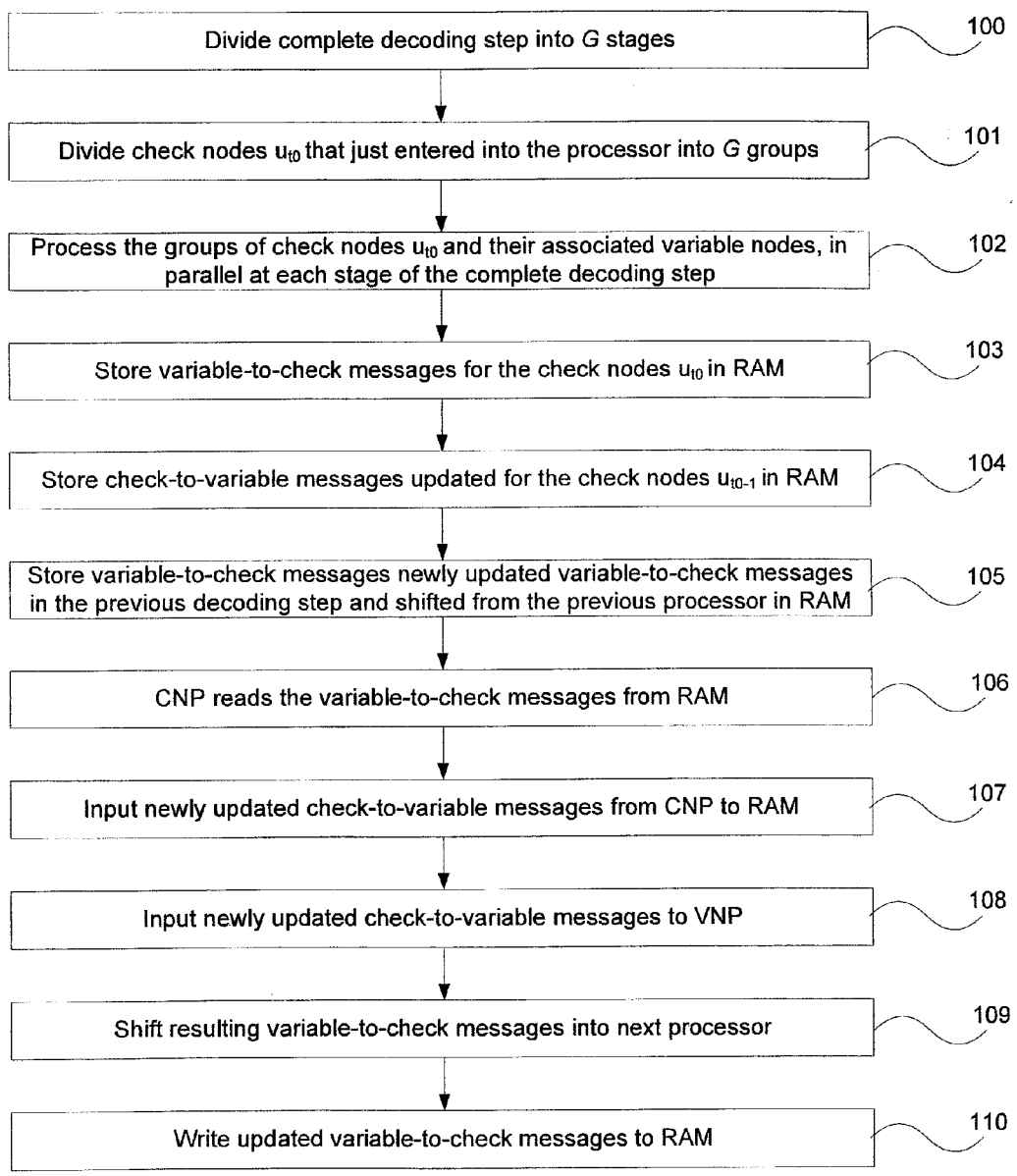
FIG. 9 is a process flow diagram of decoding LPDCCC by the LPDCCC decoder.

First the noise generator is verified by comparing the FPGA experimental results with those generated by the C program. It can be observed from FIG. 8 that the FPGA simulation results match exactly with those generated by the C program for LPDCCC of different sizes.

An efficient partially parallel decoder architecture for protograph-based LDPCCC has been provided. It can achieve a throughput of 2.0 Gb/s without using switching networks. A rate-5/6 LDPCCC of different sizes has been implemented on an Altera FPGA. Simulation results show that protograph-based LDPCCCs outperform the block code counterparts with the same throughput and similar processor complexity. Moreover, the protograph-based LDPCCCs derived from well-designed block codes can achieve an extremely low error floor and a coding gain of almost 11 dB at $10^{-13}$.

Although the decoder has been described as being implemented on a field-programmable gate array (FPGA), an Application-Specific Integrated Circuit (ASIC) may also be possible.

It will be appreciated by persons skilled in the art that numerous variations and/or modifications may be made to the invention as shown in the specific embodiments without departing from the scope or spirit of the invention as broadly described. The present embodiments are, therefore, to be considered in all respects illustrative and not restrictive.

We claim:
1. A Low-Density Parity-Check Convolutional Code (LPDCCC) decoder for partial parallel decoding of low-density parity-check convolutional codes, the decoder comprising:
  a plurality of pipeline processors to receive channel messages and edge-messages; each processor having:
    a plurality of block processing units (BPUs), each BPU having a plurality of check node processors (CNPs) to process check nodes that enter into the processor and a plurality of variable node processors (VNPs) to process variable nodes that are about to leave the processor; and a plurality of Random Access Memory (RAM) blocks for dynamic message storage of the channel messages and the edge-messages;

wherein in each processor, the VNPs are directly connected to corresponding RAM blocks, and the CNPs are directly connected to corresponding RAM blocks such that the connections from the VNPs and CNPs to the corresponding RAM blocks are pre-defined and fixed according to a parity-check matrix of an unterminated time-varying periodic LDPCCC.

2. The decoder according to claim 1, wherein RAM blocks of different processors are combined into a plurality larger RAM blocks such that each larger RAM block has a RAM block from each processor.

3. The decoder according to claim 2, wherein each larger RAM block has an address controller.

4. The decoder according to claim 3, wherein at least two larger RAM blocks share the same address controller.

5. The decoder according to claim 3, wherein the address controller is a counter that is incremented by one after every stage of decoding the LPDCCC.

6. The decoder according to claim 1, wherein the CNP is a look-up table tree.

7. The decoder according to claim 1, wherein the messages processed by the CNP and from the VNP are updated in the same stage using a shifting operation such that updated messages from the VNP and the channel messages associated with the updated variable nodes are directly output to the next processor.

8. The decoder according to claim 7, wherein a portion of updated messages from the CNP are not processed by the VNP and are written to local memories.

9. The decoder according to claim 1, wherein the edge-message is a check-to-variable message or variable-to-check message.

10. The decoder according to claim 1, wherein the messages are quantized in a few bits to reduce complexity.

11. The decoder according to claim 1, wherein the VNP is an adding operation using an adder tree.

12. The decoder according to claim 1, wherein the decoder is implemented on a field-programmable gate array (FPGA) or an Application-Specific Integrated Circuit (ASIC).

13. A method for partial parallel decoding of Low-Density Parity-Check Convolutional Codes (LPDCCCs), the method comprising:

receiving channel messages and edge-messages by a plurality of pipeline processors, and each processor having:
a plurality of block processing units (BPUs),
processing check nodes that enter into the processor by check node processors (CNPs) in each BPU;
process variable nodes that are about to leave each processor by variable node processors (VNPs) in each BPU;
dynamically storing the channel messages and the edge-messages in a plurality of Random Access Memory (RAM) blocks in each processor;
directly connecting the VNPs to corresponding RAM blocks in each processor;
directly connecting the CNPs to corresponding RAM blocks in each processor;
wherein the connections from the VNPs and CNPs to the corresponding RAM blocks are pre-defined and fixed according to a parity-check matrix of an unterminated time-varying periodic LDPCCC.

14. The method according to claim 13, further comprising combining RAM blocks of different processors into a plurality larger RAM blocks such that each larger RAM block has a RAM block from each processor.

15. The method according to claim 14, wherein each larger RAM block has an address controller.

16. The method according to claim 15, wherein at least two larger RAM blocks share the same address controller.

17. The method according to claim 14, wherein the address controller is a counter that is incremented by one after every stage of decoding the LPDCCC.

18. The method according to claim 13, wherein the CNP is a look-up table tree.

* * * * *